United States Patent [19]
Wong

[11] Patent Number: 5,568,684
[45] Date of Patent: Oct. 29, 1996

[54] METHOD OF ENCAPSULATING AN ELECTRONIC DEVICE

[75] Inventor: Ching-Ping Wong, Lawrenceville, N.J.

[73] Assignee: Lucent Technologies Inc., Murray Hill, N.J.

[21] Appl. No.: 181,072

[22] Filed: Jan. 14, 1994

Related U.S. Application Data

[62] Division of Ser. No. 936,445, Aug. 28, 1992, Pat. No. 5,317,196.

[51] Int. Cl.$^6$ .............................. B29C 45/14; B29C 70/70
[52] U.S. Cl. .................. 29/840; 29/841; 264/272.13; 264/272.15; 264/272.17; 156/69
[58] Field of Search .................. 264/272.13, 272.15, 264/272.17; 428/447, 450; 290/840, 841, 850; 156/69

[56] References Cited

U.S. PATENT DOCUMENTS

| | | | |
|---|---|---|---|
| 3,716,764 | 2/1973 | Birchler | 264/272.11 |
| 4,057,596 | 4/1977 | Takamizawa et al. | 260/825 |
| 4,374,967 | 2/1983 | Brown et al. | 528/15 |
| 4,477,626 | 10/1984 | Suzuki | 524/862 |
| 4,564,562 | 1/1986 | Wong | 428/447 |
| 4,592,959 | 6/1986 | Wong | 428/450 |
| 4,698,386 | 10/1987 | Fujimoto | 524/862 |
| 4,719,274 | 1/1988 | Wong | 528/15 |
| 4,720,431 | 1/1988 | Wong | 428/447 |
| 4,801,561 | 1/1989 | Sankhagowit | 264/272.11 |
| 4,810,768 | 3/1989 | Wong | 528/21 |
| 4,888,226 | 12/1989 | Wong | 428/76 |

*Primary Examiner*—Jan H. Silbaugh
*Assistant Examiner*—Angela Ortiz
*Attorney, Agent, or Firm*—Roderick B. Anderson; Lester H. Birnbaum

[57] ABSTRACT

An electronic device (12, 13) is substantially enclosed by a fluid encapsulant (17). The fluid encapsulant consists essentially of a silicone resin and a catalyst selected from the group consisting of platinum and tin. The silicone resin is selected from the group consisting of polydimethlysiloxane, polymethylphenylsiloxane, polydimethyldiphenylsiloxane, and mixtures thereof. Such silicone resins comprise molecules terminating in vinyl components and hydride components. The molar ratio of vinyl components to hydride components is maintained within the range of five to twenty. As will be explained more fully later, this ratio of vinyl components to hydride components assures that the resin will remain substantially a liquid even after cure, due to limited cross-linking or polymerization during the cure. The electronic device is contained within a container (16) having a sealed cover (18) for containing the liquid encapsulant during the operation of the electronic device.

2 Claims, 1 Drawing Sheet

METHOD OF ENCAPSULATING AN ELECTRONIC DEVICE

This is a division of application Ser. No. 07/936,445, filed Aug. 28, 1992, now U.S. Pat. No. 5,317,196.

TECHNICAL FIELD

This invention relates to the use of polymers to encapsulate electronic devices and, more particularly, to the use of silicone resin as an encapsulant.

BACKGROUND OF THE INVENTION

The U.S. Pat. No. of Wong, No. 5,051,275, granted Sep. 24, 1991, contains a discussion of numerous references describing the use of silicone resin as an electronic device encapsulant. Various silicone resin compounds and mixtures have been shown to have the appropriate electrical and mechanical characteristics for covering an electrical device such as an integrated circuit and protecting it from outside contaminants, while constituting a good dielectric which does not interfere with the electrical performance of the device.

A method for mounting integrated circuit chips which is becoming more widely used is known as flip-chip surface mounting. The circuitry of an integrated circuit chip and the active devices of it are typically formed on only one surface of the chip. With flip-chip surface mounting, solder bumps are used to bond the active surface of the chip to the surface of a substrate such that the active surface of the chip faces the substrate surface and is separated from it by a small distance. Such chips may be protected from outside contaminants by a hermetic package, which of course is relatively expensive, bulky, and further complicates the assembly process. It has been difficult to use silicone resin encapsulants for many of such devices because many resins, even in their uncured condition, cannot dependably fill the small gap between the semiconductor chip and the substrate surface. A larger problem is that silicone resins normally have different thermal expansion characteristics from either semiconductors or the ceramics that are typically used as substrates. Consequently, under extreme temperature conditions, the differential thermal expansion of the silicone encapsulant may break the solder bonds joining the chip to the substrate. Finally, any material used as a non-hermetic encapsulant must often withstand relatively high voltages per unit of distance, due to the increasingly close spacing of conductors on integrated circuits, as well as the absolute voltages developed.

There is therefore a continued long-felt need for dependable encapsulations for electronic devices, particularly encapsulations for flip-chip surface mounted integrated circuits that are subjected to relatively high electrical voltages and to relatively wide changes of temperature.

SUMMARY OF THE INVENTION

In accordance with an illustrative embodiment of the invention, an electronic device is substantially enclosed by a fluid encapsulant. The fluid encapsulant consists essentially of a silicone resin and a catalyst selected from the group consisting of platinum and tin. The silicone resin is selected from the group consisting of polydimethylsiloxane, polymethylphenylsiloxane, polydimethyldiphenylsiloxane, and mixtures thereof. Such silicone resins comprise molecules terminated in vinyl components and hydride components. The molar ratio of vinyl components to hydride components is maintained within the range of five to twenty. As will be explained more fully later, this ratio of vinyl components to hydride components assures that the resin will remain in substantially a fluid state even after cure, due to limited cross-linking or polymerization during the cure. Accordingly, the electronic device is contained within a container having a sealed cover for containing the fluid encapsulant during the operation of the electronic device.

Where the electronic device is an integrated circuit that is flip-chip surface mounted on a ceramic substrate, the fluid encapsulant dependably contacts the active surface of the semiconductor chip, interacts with the surface, and protects the surface from any outside contaminants. The encapsulant provides dependable insulation under high voltages, and any differential expansion or contraction does not affect the solder bonds of the chip to the substrate.

DETAILED DESCRIPTION

Figure 1:
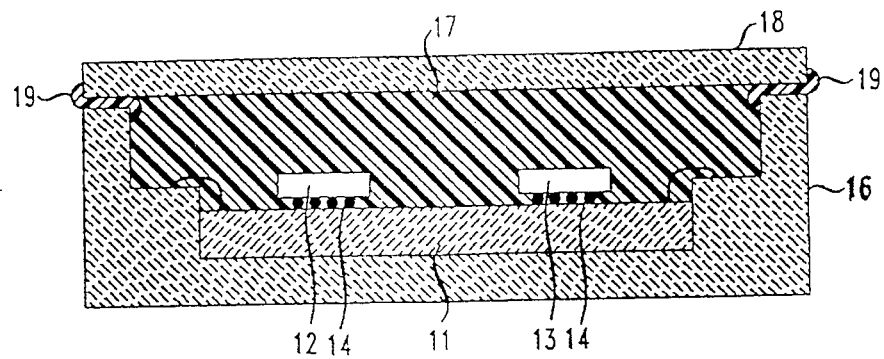
FIG. 1 is a schematic sectional view of a packaged semiconductor integrated circuit in accordance with an illustrative embodiment of the invention.

Referring now to FIG. 1, there is shown schematically a substrate 11, which may be ceramic or silicon, for example, upon which are mounted semiconductor integrated circuits 12 and 13. The figure is not intended to be to scale and certain of the dimensions have been distorted for purposes of illustration. The semiconductor integrated circuits have active surfaces containing most of the device circuitry and most of the active elements of the device. These surfaces are bonded to the semiconductor substrate by an arrangement of solder bonds 14 in accordance with the known principles of flip-chip surface mounting. In accordance with this known process, solder bumps are typically formed on the active surfaces of the chips, the solder bumps are contacted to bonding pads on the upper surface of the substrate 11, the solder is heated to melt or reflow it and cooled to effect the bond. Twenty to sixty solder bumps may typically be used to bond a single chip to the substrate. After bonding takes place, the active surface of the integrated circuit is typically separated from the upper surface of the substrate by a distance of about two mils. The problem with which the invention is concerned is the difficulty of assuring that conventional silicone resin will flow into this small gap before cure to make contact with substantially the entire exposed active surfaces of the chips, and that, after cure, differential expansion will not cause the resin to break the solder bonds.

After the bonding of the chips to the substrate, the substrate 11 is adhered to the bottom of a container 16 which may be of ceramic or other appropriate material. Wire bonds may be employed as shown to provide additional connections between the integrated circuits and the substrate 11 and between the substrate and conductor on container 16 for connection to external circuitry. In accordance with the invention, the container 16 is then filled with a fluid encapsulant 17 consisting essentially of a silicone resin and a catalyst selected from the group consisting of platinum and tin. The silicone resin is selected from the group consisting of polydimethylsiloxane, polymethylphenylsiloxane, polydimethyldiphenylsiloxane, and mixtures thereof. The silicone resin comprises molecules terminated in vinyl components and hydride components. In accordance with an aspect of the invention, the molar ratio of vinyl components to hydride components is in the range of five to twenty and preferably in the range of ten to twenty. The silicone resin is cured in the usual manner by heating at a temperature such as one hundred seventy-five degrees Centigrade for a period of time such as two hours.

As is known, the application of heat in conjunction with the catalyst causes polymerization of the silicone resin: in other words, it causes cross-linking of the siloxane molecules of the resin. Because there are many more vinyl components to the molecules than hydride components, the cross-linking is much less extensive than is normally the case. That is, the molar ratio of vinyl components to hydride components is normally in the range of about 4:1 to 1:4 which permits extensive cross-linking during the cure step, resulting in solidification of the resin. With the vinyl-hydride molar ratio used in the present invention, the cross-linking is insufficient to allow the resin to change from the liquid state to a completely solid state. As a consequence, the encapsulant 17 remains fluid even after cure.

After cure, a cover 18 is bonded to container 16 to contain permanently the fluid encapsulant 17. Although the cover may be secured by any of a number of bonding agents, it is preferred that a silicone elastomer resin 19 be used for this purpose, since conventional silicone elastomers are known to be noncontaminating.

Figure 2:
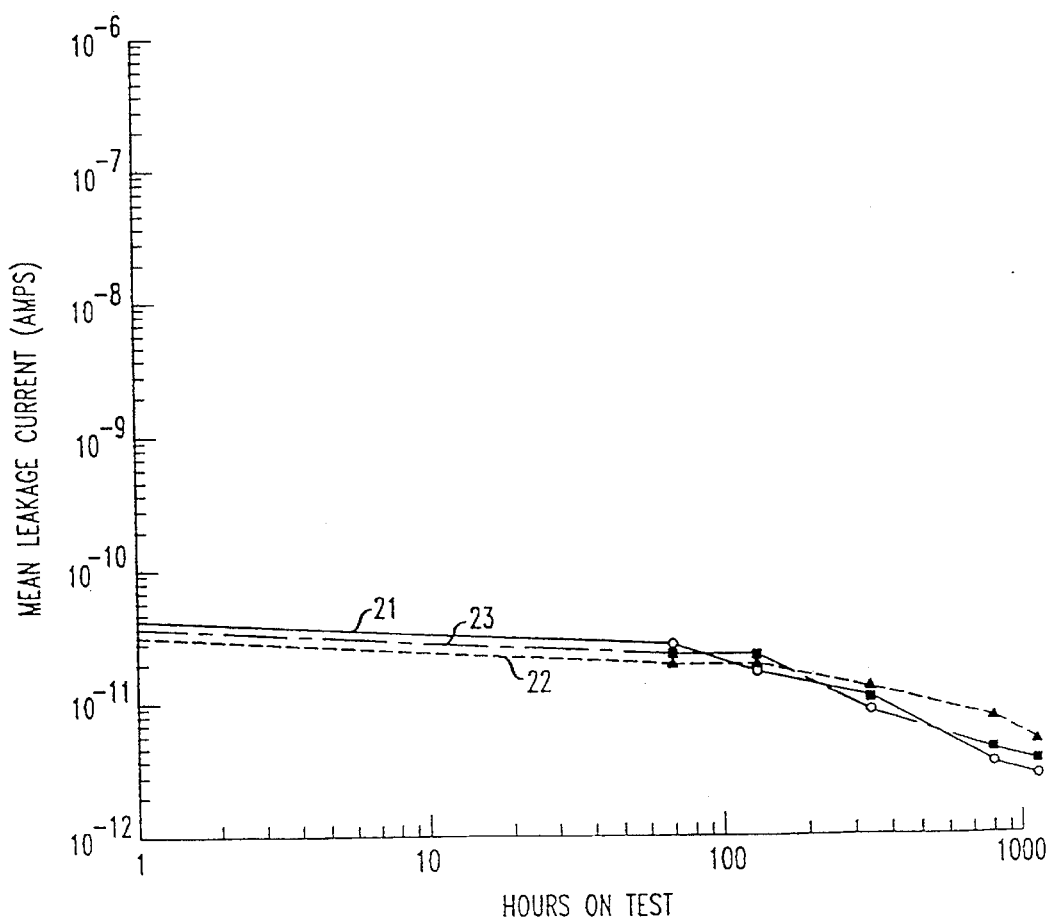
FIG. 2 is a graph showing changes of leakage current with time for semiconductor integrated circuits encapsulated by various silicone resins.

FIG. 2 shows the results of various tests made on various silicon integrated circuits encapsulated with silicone resin. All of the encapsulants were cured at one hundred seventy-five degrees Centigrade for two hours. The silicone resin was, in all cases, DC3-4939, a polydimethylsiloxane and polymethylphenylsiloxane silicone resin, commercially available from the Dow Chemical Company of Midland, Michigan, which contains a small amount of platinum catalyst in addition to the silicone. The DC3-4939 is designated "A" or "B," the A designating a resin terminated with vinyl functional components and the B designating a resin terminated with a hydride functional component. In both cases, the resin is about eighty percent polydimethylsiloxane and twenty percent polymethylphenylsiloxane.

The integrated circuit contained ten micron wide conductor lines and spaces and was biased at ten volts, a relatively high voltage relative to the line width and line spacing. The mean leakage current in amps was plotted against the hours during which the encapsulated integrated circuit was operated while exposed to an environment of eighty-five degrees Centigrade and eighty-five percent relative humidity. Curve 21 represents a resin having a 1:1 molar ratio of vinyl components (Part A) to hydride components (Pan B). Curve 22 represents a 10:1 molar ratio, and curve 23 represents a 20:1 molar ratio of vinyl to hydride components. As can be seen, in all cases, the mean leakage current, that is, the spurious leakage current across the encapsulant, actually declines as a function of hours of operation. This reflects the fact that, in all cases, ions in the encapsulant were depleted as a function of time. In any event, the spurious leakage current was always well below $10^{-10}$ amps which indicates excellent electrical performance. The purpose of the curves of FIG. 2 is to demonstrate that the electrical performance of the silicone resin encapsulant does not significantly vary with changes of the vinyl to hydride ratio. Molar ratios of 1:1 have been widely used in the prior art, and the graph demonstrates that a ratio of 20:1 will result in a liquid encapsulant after cure that provides substantially the same electrical performance. The 20:1 ratio, however, gives a liquid resin after cure, while the 1:1 ratio yields a cured resin that is solid and robber-like.

The curing of the silicone resin having ratios of 5:1 to 20:1 establishes an interaction or adherence of the resin with the active surfaces of the integrated circuit chips. This tends to provide a permanent protection from the environment and a stable electrical performance to the packaged device. The entire package resembles a hermetically sealed package, but it is to be emphasized that the package need not be hermetically sealed. That is, a lack of hermeticity of the seals 19 will not affect the protection of the devices 12 and 13. Thus, the package of FIG. 1 is not as complicated to assemble as is a hermetic package, and it is not as susceptible to deterioration as a hermetic package might be due to a rupture of the hermetic seal. The fluid nature of the encapsulant distributes thermal stresses and prevents any damage to the devices. For this purpose, a molar ratio of 10:1 to 20:1 is preferred to give a thinner liquid encapsulant. A ratio in excess of 20:1 may not give effective interaction with the semiconductor surfaces. The relative superiority of encapsulants having high ratios for withstanding temperature cycling of −30° C. to 120° C. has been experimentally demonstrated.

While the invention is particularly applicable to flip-chip surface mounted integrated circuit devices, it is clear that the novel fluid encapsulant described may be applicable to other devices as well. Various other embodiments and modifications may be made by those skilled in the art without departing from the spirit and scope of the invention.

I claim:

1. A method for encapsulating an electronic device comprising the steps of:

bonding the electronic device to a substrate;

inserting the substrate in a bottom of a container;

substantially filling the container with a fluid encapsulant;

said fluid encapsulant consisting essentially of a silicone resin and a catalyst selected from the group consisting of platinum and tin;

the silicone resin selected from the group consisting of polydimethylsiloxane, polymethylphenylsiloxane and polydimethyldiphenylsiloxane;

said silicone resin comprising molecules terminated in vinyl components and hydride components, the molar ratio of vinyl components to hydride components being in a range of 10:1 to 20:1;

and heating the fluid encapsulant to cause molecular cross-linking therein while keeping the encapsulant in a fluid state.

2. The method of claim 1 further comprising the step of:

sealing a lid to a top of the container.

* * * * *